United States Patent [19]

Beasom

[11] Patent Number: 4,873,564

[45] Date of Patent: Oct. 10, 1989

[54] CONDUCTIVITY-MODULATED FET WITH IMPROVED PINCH OFF-RON PERFORMANCE

[75] Inventor: James D. Beasom, Melbourne Village, Fla.

[73] Assignee: Harris Corporation, Melbourne, Fla.

[21] Appl. No.: 110,775

[22] Filed: Oct. 21, 1987

Related U.S. Application Data

[63] Continuation-in-part of Ser. No. 790,117, Oct. 22, 1985, abandoned.

[51] Int. Cl.[4] ............... H01L 29/06; H01L 29/80; H01L 27/12
[52] U.S. Cl. ................................ 357/49; 357/20; 357/22; 357/90
[58] Field of Search .................................. 357/22, 90

[56] References Cited

U.S. PATENT DOCUMENTS

| | | | |
|---|---|---|---|
| 3,836,998 | 9/1974 | Kocsis et al. | 357/49 |
| 4,187,514 | 2/1980 | Tomisawa et al. | 357/22 |
| 4,354,121 | 10/1982 | Terasawa et al. | 357/22 |
| 4,514,747 | 4/1985 | Miyata et al. | 357/90 |

FOREIGN PATENT DOCUMENTS

| | | | |
|---|---|---|---|
| 52-30279 | 3/1977 | Japan | 357/22 |

OTHER PUBLICATIONS

A. S. Grool, *Physics and Technology of Semicondensate Process*, John Wiley & Sons (1967) pp. 78–82).

Primary Examiner—J. Carroll
Attorney, Agent, or Firm—Antonelli, Terry & Wands

[57] ABSTRACT

The constraint on the channel thickness of a conductivity-modulated FET is reduced by forming the junction gate region of a pair of differentially doped regions, one inside the other. The first, larger region, which extends from the surface of the island region to a prescribed depth therein, has a lower impurity concentration and higher resistivity, approximating that of the island region in which it is formed. Disposed in a surface portion of this first, high resistivity, low impurity concentration region is a second, relatively shallow, region more heavily doped than the deeper high resistivity region. During the on-condition of the FET, the thickness of the channel is effectively region beneath the low impurity concentration gate region and the semiconductor material of the low impurity concentration gate region beneath the relatively shallow high impurity concentration low resistivity region formed therein. As a result, during the on-condition of the FET, the on-resistance is effectively reduced because of the increased effective channel thickness. In the off state, excess carriers which conductivity-modulate the channel are not present, so that the channel thickness is confined in the island region and the bottom of the channel. This reduced off thickness yields a lower pinch off voltage.

35 Claims, 3 Drawing Sheets

CONDUCTIVITY-MODULATED FET WITH IMPROVED PINCH OFF-RON PERFORMANCE

CROSS REFERENCE TO RELATED APPLICATIONS

This is a continuation-in-part of my earlier filed U.S. patent application No. 790,117, filed Oct. 22, 1985, entitled "Conductivity-Modulated FET With Improved Pinch Off-Ron Performance", assigned to the Assignee of the present application now abandoned.

FIELD OF THE INVENTION

The present invention relates in general to semiconductor devices and is particularly directed to a channel conductivity-modulated field effect transistor having reduced on-resistance and improved pinch off performance.

BACKGROUND OF THE INVENTION

Field effect transistors normally operate as majority carrier devices, the on-resistance of which is established by channel geometry and resistivity. Examples of such devices are described in the U.S. patents to Tomisawa et al 4,187,514 and Terasawa et al 4,354,121.

In a conventional conductivity-modulated field effect transistor, one example of which is described in the above-referenced Terasawa et al patent, a gate region of a conductivity type opposite to that of the semiconductor material through which the channel is provided is formed in the upper surface of the device. (The device described in the Tomisawa et al patent is a junction field effect device, but it is not a conductivity-modulated JFET.)

A cross-sectional illustration of the configuration of a conventional conductivity-modulated hybrid gate (both junction and MOS gates) field effect transistor employed for high voltage applications (500–600 volts, with a breakdown voltage on the order of 700 volts) is shown in FIG. 1. For purposes of explanation, the device shown is an N channel device, comprising an N-type monocrystalline silicon region 15 formed in one surface 11 of a polysilicon substrate 10 and dielectrically isolated from the semiconductor material of the substrate 10 by a layer of dielectric isolation 12 (e.g. silicon dioxide) formed between the island region 15 and the substrate 10. Disposed in a first surface portion of the island region 15 is an N+ channel contact (cathode) region 13. Spaced apart from the channel contact region 13 is an opposite conductivity (P+) (anode) region 14 which forms a PN junction 17 with the semiconductor material of the island region 15. Minority carriers may be injected into the island region 15 by forward biasing the PN junction 17 formed between P+ region 14 and the N-type material of the island region 15.

For defining the effective operational geometry of the channel 16 of the FET, a junction gate region 18, having a conductivity (here P type) opposite to that (N) of the island region 15 is formed in a surface portion of the island region 15 between the channel contact (cathode) region 13 and the diode forming (anode) region 14. Gate region 18 defines a PN junction 19 with the semiconductor material of the island region 15 and extends to a depth D from the surface 11 of the island region 15, so as to define an effective thickness t of channel 16 formed between the bottom 20 of junction gate region 18 and the bottom 21 of the island region 15 therebeneath. In a channel conductivity-modulated FET, the resistance $R_c$ of the channel 16 can be reduced by conductivity modulating the channel 16 with minority carriers that are injected by forwarding biasing PN junction 17.

During a first mode of operation (on-state) of the device, in the absence of the application of a pinch-off voltage to the junction gate region 18, namely when the channel is conductive and the device is turned on, the on-resistance, Ron, of the channel 16 is defined as:

$$Ron = pL/tw \qquad (1)$$

where:
p = the resistivity of the conductivity-modulated channel 16,
L = the length of the channel 16
t = the thickness of the channel 16, and
w = the width of the channel 16 (the width being in a direction perpendicular to each of the length L and thickness t arrows shown in FIG. 1).

For a second mode of operation (the off-state), the pinch off voltage for rendering the channel 16 effectively nonconductive is defined by:

$$V_p = qNt^2/2E \qquad (2)$$

where:
q = electron charge,
N = the coping concentration of the channel 16, and
E = the dielectric constant of the channel 16.

From equations (1) and (2), it can be seen that the thickness t of the channel 16 must be kept small to hold the pinch off voltage $V_p$ at a low value, while the thickness t should be made large in order to reduce the on-resistance Ron.

In integrated circuit structures which require high voltage JFETs, the occupation area of the island region is typically quite large in order to provide the necessary channel thickness and depth of the island region to achieve the necessary high voltage characteristics. This large occupation area severely handicaps the integration density of the overall integrated circuit structure in which such a high voltage device is to be incorporated.

An additional limitation of a conventional conductivity-modulated field effect transistor structure is that it conducts and has modulated channel resistance only when the anode region 14 is at a higher voltage than the cathode region 13.

In a typical application of a conductivity-modulated field effect transistor to a switch incorporating a pair of devices for handling signals of both positive and negative voltage polarities, an anti-parallel connection as shown in FIG. 2 may be employed. As shown therein, a pair of conductivity-modulated field effect transistors Q1 and Q2 are connected in anti-parallel connection with the anode-cathode paths thereof intercoupled between terminals 1 and 2 and the gates thereof connected in common to a gate terminal 3. In this circuit configuration, transistor Q1 conducts when the voltage applied to terminal 1 is positive, while transistor Q2 conducts when the voltage applied to terminal 2 is positive. Obviously, the need to incorporate a pair of devices into a dual voltage polarity switch increases the required circuit occupation area and cost of manufacture of the switch device.

An additional shortcoming of a conventional conductivity-modulated field effect transistor is the fact that the device does not conduct until a diode forward voltage has been applied between the anode region and the cathode region. Since some circuit applications require that the switch employed conducted a lower voltage, the conventional conductivity-modulated field effect transistor cannot be utilized.

SUMMARY OF THE INVENTION

In accordance with a first aspect of the present invention, the above-described constraint on the thickness of the island region and the conductivity-modulated channel of a high voltage field effect transistor are relaxed, so that the size of the field effect transistor can be substantially reduced as compared with a conventional structure (shown in FIG. 1 referenced above) and thereby significantly improve the integration density of circuit structures in which a device may be incorporated.

Pursuant to an additional feature of the invention, the voltage required to turn on the device may be reduced to less than the diode forward voltage, so that the conductivity-modulated field effect transistor may be employed for low voltage applications.

Pursuant to the first aspect of the invention, the channel thickness constraint is reduced by forming the junction gate region of a pair of differentially-doped regions, one inside the other. The first, larger region, extends from the surface of the island region in which the device is formed to a prescribed depth therein, and has a lower impurity concentration and higher resistivity (approximating that of the island region in which it is formed). Disposed in a first surface portion of this, high resistivity, low impurity concentration region is a second, relatively shallow, region more heavily (at least in order of magnitude) doped than the deeper high resistivity region. In effect, the formation of the second, more heavily doped, shallow region in the first, deeper, lightly doped region results in an impurity concentration profile that has an abrupt or discrete knee portion at the interface of the heavily doped shallow region with the more lightly doped deeper region therebeneath. At this knee region, where the composite impurity concentration profile of the dual gate structure undergoes dramatic change, resulting in a gradual decrease towards the channel region from the very high impurity concentration profile of the shallow region. As a consequence, the performance of the transistor is significantly improved compared with that of conventional single gate structure of the prior art, including those of the patented devices discussed above.

More specifically, during the on-condition of the field effect transistor, the thickness of the channel is effectively comprised of both the semiconductor material of the island region beneath the low impurity concentration gate region and also the semiconductor material of the low impurity concentration gate beneath the relatively shallow high impurity concentration, low resistivity region formed therein. As a result, during the on condititon of the field effect transistor, the on-resistance is effectively reduced because of the increased effective channel thickness. As a consequence, a significant fraction of the current flows through the conductivity modulated high resistivity gate.

In the off state, excess carriers, which conductivity-modulate the channel, are not present, so that the channel thickness ($t_{off}$) is confined in the island region from the interface between a high resistivity gate region and the bottom of the channel. This reduced off thickness ($t_{off}$) yields a lower pinch off voltage.

Pursuant to a second aspect of the invention, in order to reduce the voltage which is applied across the anode and cathode regions for causing conduction of the device, an additional (high impurity concentration) ohmic contact (auxiliary cathode) region is formed in the channel island region adjacent the anode region. The auxiliary cathode contact region and the anode region are arranged such that current flow from the auxiliary cathode region through the material of the channel will develope a voltage drop such that, when the anode region and auxiliary cathode region are tied together, the voltage drop will occur in the island material adjacent to the anode region-island material junction at a prescribed current. When this voltage drop is achieved, the anode region will begin to conduct. As it conducts, the anode region will inject holes into the semiconductor material of the island channel, which will reduce the resistance and thereby contribute to conductivity modulation.

In accordance with a further embodiment of this aspect of the invention, a dual spaced-apart anode region/cathode region pair are formed in the island semiconductor material of which the channel is formed on either side of the gate region. The anode region and its adjacent ohmic channel (cathode) contact region may be connected directly together or have a resistance circuit element placed therebetween. In either case, this improved structure is capable of conducting with either a positive or negative polarity voltage applied to it. Whichever terminal is more positive will have its anode region turn on when the appropriate voltage is applied. The more negative terminal will conduct through its cathode contact region only when the adjacent anode region (which is reversed biased by current flow from the opposite terminal) is active.

In either embodiment, the necessity of applying a large magnitude voltage to enable the device to conduct at a diode forward voltage between the anode and cathode regions is obviated.

DETAILED DESCRIPTION

Figure 3:
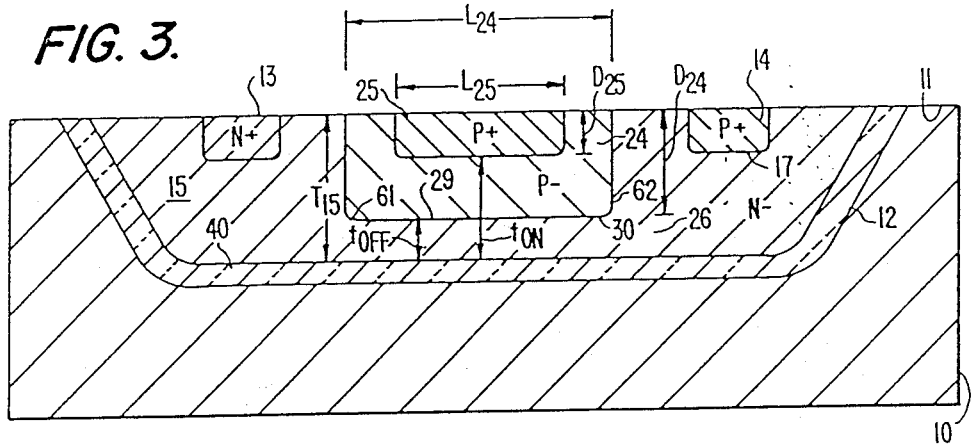
FIG. 3 is a cross-section illustration of a differentially doped gate region field effect transistor in accordance with a first embodiment of the present invention.
Figure 4:
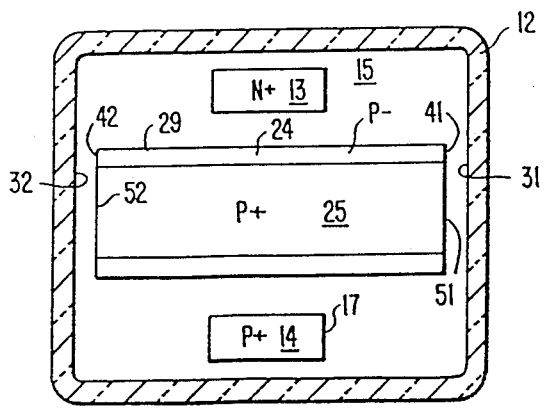
FIG. 4 is a plan view of the field effect transistor structure of FIG. 3.

Referring now to FIGS. 3 and 4, respective cross-sectional and plan views of the semiconductor structure of a first embodiment of an improved conductivity-modulated field effect transistor configuration in accordance with the present invention employing a differentially doped junction gate is shown. In accordance with this aspect of the invention, in place of a single region junction gate (region 18 in FIG. 1 described above), the field effect transistor employs a dual region junction gate comprised of a pair of differentially doped regions 24 and 25. As shown in FIGS. 3 an 4, a first relatively high resistivity portion 24 of the dual gate region junction gate is comprised of P semiconductor material having a length $L_{24}$ and depth $D_{24}$ within an N-island region 15. A second, relatively low resistivity, shallow portion 25 of the dual region junction gate is formed of P+ material extending from a surface portion of region 24 to depth $D_{25}$ therein, which is less than the depth $D_{24}$ of portion 24. The length $L_{25}$ of relatively shallow portion 25 is shown as being less than the length $L_{24}$ of region 24. However, the length of shallow portion 25 may extend beyond portion 24, so as to overlap the island region 15. What is important is that there exist high resistivity material in region 24 between the low resistivity region 25 and the underlying channel 26 of the gate.

Preferably, the impurity concentration of shallow region 25 is at least an order of magnitude larger than that of region 24. For the embodiment of an N-channel field effect transistor, the semiconductor material of the island region 15 is of high resistivity N-type silicon having an overall thickness $T_{15}$, as shown in FIG. 3. The depth to which opposite conductivity type (P−) high resistivity, low impurity concentration gate region 24 extends into the N-island region 15 will govern the off thickness $t_{OFF}$ of the channel 26 which, in the OFF-mode of operation of the transistor, is confined between the bottom 30 of the high resistivity gate region 24 and the bottom 40 of the island region 15. As shown in FIG. 3, the bottom 30 of the high resistivity gate region 24 effectively corresponds to the junction interface between the P− material of region 24 and the N− material of island region 15 (namely its interface with dielectric isolation layer 12).

Figure 5:
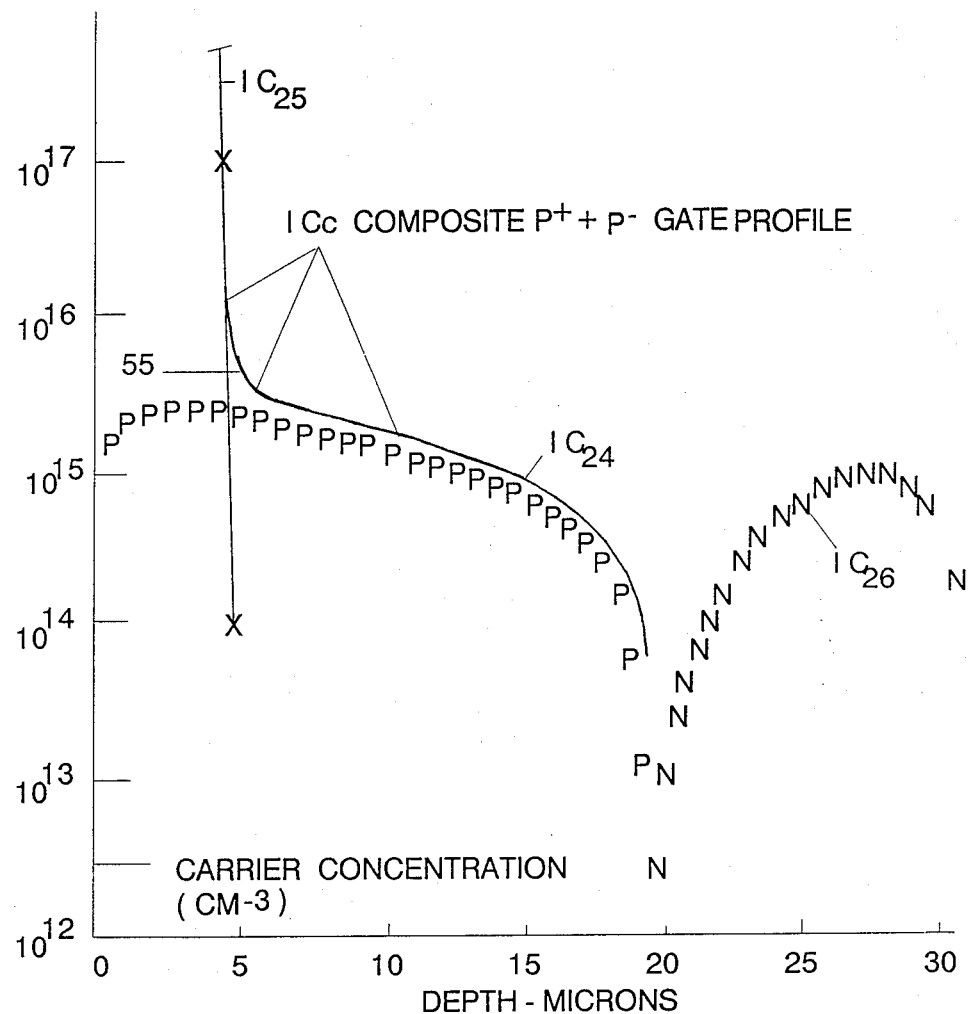
FIG. 5 illustrates the variation in doping concentration profiles of the differentially doped gate and channel regions of the field effect transistor structure illustrated in FIG. 3.

At the bottom 50 of shallow portion 25, which is formed to a depth of $D_{25}$ within region 24, is preferably spaced apart from the bottom 30 of region 24 by at least one-half the thickness $D_{25}$ of shallow region 25 and, preferably, by at least the thickness or depth $D_{25}$ of region 25. Namely, the depth $D_{24}$ of region 24 is preferably at least twice the depth $D_{25}$ of region 25 and, in any event, is equal to at least 1.5 $D_{25}$. Moreover, the peak impurity concentration region of high resistivity region 24 is at least an order of magnitude lower than the peak impurity concentration of region 25. In this regard, FIG. 5 illustrates a composite $IC_c$ of the respective impurity concentrations of heavily doped shallow region 25 and more lightly doped high resistivity deeper region 24 in which region 25 is formed, together with the doping profile of the channel region 26 therebeneath. The profiles shown in FIG. 5 represent the relationship between the carrier concentration ($CM^{-3}$) and the depth (in microns) from the upper surface 11 of the island region 15 to the bottom 40 thereof at interface with the dielectric isolation layer 12. In the example from which the composite profile shown in FIG. 5 was derived, island region 15 has a depth on the order of 30 microns. High resistivity low impurity concentration region 24 has a depth $D_{24}$ on the order of 17 microns and shallow region 25, formed therein, has a depth on the order of 5 microns.

As can be seen from FIG. 5, the impurity concentration $IC_{25}$ of low resistivity heavily doped region 25 increases abruptly to a value in excess of $10^{18}$ carriers per cubic centimeter as one departs towards the surface 11 of the structure from the interface 50 between region 25 and region 24 (depth on the order of 5 microns). The impurity concentration of region 24, on the other hand, tapers relatively gradually from a peak value on the order of $5 \times 10^{15}$ carriers $CM^{-3}$ to a value on the order of $10^{14}$ carriers $CM^{-3}$ in a zone adjacent its interface 30 with the channel region 26. The impurity concentration profile $IC_{26}$ of the channel region 26 itself is shown as a gradual increase from the PN junction 30 to a relatively stable value on the order of $2 \times 10^{14}$ carriers $CM^{-3}$ at the bottom of the channel.

The composite impurity concentration characteristic $IC_c$ resulting from the formation of dual regions 24 and 25 yields an abrupt departure from impurity concentration profile $IC_{24}$ at a knee portion 55, beyond which (towards the surface 11) the impurity concentration of the gate increases abruptly to the neighborhood of the $10^{18}$ value. This abrupt change or knee in the composite impurity concentration profile of the dual region gate forms an effective electronic barrier or channel confinement zone which defines the extent or thickness of the conductivity-modulated channel during the on condition of the transistor. Namely, because the junction gate is formed of two differentially doped regions 24 and 25 (region 25 having a relatively high impurity concentration (at least an order of magnitude greater than of region 24)) and region 24 having a gradually tapered impurity concentration as represented by profile $IC_{24}$), there is obtained a variation in the effective thickness of the channel during the ON and OFF modes of the operation of the transistor, so as to achieve both a low on-resistance and a low pinch-off voltage.

More specifically, during the ON mode of the device, the low impurity concentration, high resistivity P− region 24, which is adjacent to the channel defined by the semiconductor material of the island region 15 itself beneath the bottom 30 of the gate region 24 and the bottom 40 of the island region, is conductivity-modulated by the same carriers which conductivity modulate the channel 26. Thus, during the ON mode of operation, region 24 becomes part of the channel, so that the thickness $t_{ON}$ is effectively increased, thereby reducing the on resistance (Ron). On the other hand, in the OFF state, the excess carriers which conductivity-modulate the channel are not present, and the channel thickness is defined by the distance between the bottom 30 of the region 24 and the bottom 40 of the island region 15; namely between the junction 29 with the high resistivity P− region 24 and the bottom 40 of the island region 15 at its interface with the dielectric oxide 12. This smaller distance $t_{OFF}$ during the OFF state leads to a low pinch-off voltage.

The lower resistivity, high impurity concentration gate region 25, formed in the upper surface portion of gate region 24, limits the channel thickness and also provides a low resistance path through which the channel charge can flow during gate turn off of channel current, thereby providing a high gate turn off gain. Thus, the differentially doped gate region comprising the high resistivity region 24 and the low resistivity region 25 effectively combine to provide a mode dependent channel thickness. During the ON mode, the high resistivity portion 24 of the differential gate is effectively comparable to the N-island region 15, so that the channel thickness is effectively increased, thereby reducing the on resistance Ron. The channel thickness itself is delimited by the depth to which the high impurity concentration, low resistivity region 25 extends into the region 24.

Contrasted with this improved operation resulting from the modified impurity concentration profile of the dual region gate of the present invention, the transistor structures of the above-referenced Tomisawa et al and Terasawa et al patents employ single gate region structures the impurity concentration profiles of which have a gradually varying concentration, rather than a differential profile shown in FIG. 5, described above. As an illustration of the type of profile that results from the doping of a diffused region into a semiconductor material, reference may be had to the text "Physics and Technology of Semiconductor Devices", by A. S. Grove, John Wiley and Sons (1967), pages 78–82. FIG. 3.34 of that text shows the gradually tapering profile of a diffused semiconductor region, effectively corresponding to the single region gate 18 of the configuration shown in FIG. 1 of the drawings, referenced above, and the single gate regions of the Tomisawa et al and Terasawa et al type devices.

In a practical embodiment of the invention, each of regions 24 and 25 may be diffused from the surface 11. As such, there is the normal Gaussian impurity distribution profile through the regions 24 and 25 individually, so that the effective on thickness $t_{ON}$ is defined by this distribution, which is established in accordance with the intended operational parameters of the device. It is also possible to define the physical limits of the channel thickness by etching a surface portion of a diffused high resistivity region 24 and then refilling that etched portion with a highly doped low resistivity surface region. The particular steps which are employed to form the differentially doped gate region are not critical for achieving the sought-after characteristics of the device, as the impurity concentration profiles are tailored in accordance with the current and voltage levels sought to be controlled.

In addition to providing a mode-dependent channel thickness, the differentially doped gate region of the present invention provides improved gate channel breakdown voltage. Because of the lower impurity concentration of the high resistivity gate region 24, there is reduced impurity gradient at the PN junction 29 defined between region 24 and the semiconductor material of the island region 15. This gradient may be further reduced by more gradually tailoring the physical configuration of the junction 29 so as to have a relatively large radius of curvature at zones 61 and 62 as viewed in FIG. 3. This advantage is due to the fact that the channel thickness is mode dependent and not precisely established by the geometry of the gate region, but rather by the differential impurity concentration profile of region 24 and region 25.

In the plan view of the device illustrated in FIG. 4, the sides 41 and 42 of the high resistivity region 24 are separated from the sides 31 and 32 of the island region 15, and the sides 51 and 52 of the low resistivity region 25 are spaced apart from the sides 31 and 32 of the island region. In the formation of the device, an overlap between the sides 41 and 42 of the high resistivity region 24 and the sides 31 and 32 of the island region at the interface with the dielectric isolation layer 12 is not detrimental to the operation of the device, although the turn-off operation of the device will be somewhat degraded. it is preferred that there be a spacing between the sides 51 and 52 and the sides 31 and 32, respectively, of the island region 15, in order not to degrade the breakdown voltage.

As noted above, while the foregoing embodiment of the invention has been described for an N channel device, it is equally applicable to a P channel device with the conductivity types of the respective regions being appropriately reversed.

As mentioned previously, in accordance with a further aspect of the invention, the voltage required to cause conduction of the conductivity modulated field effect transistor can be reduced to a value less than a diode forward voltage drop between the anode region and the cathode region by providing a pair of spaced apart anode/cathode regions on one or both sides of the gate region. This improved aspect of the present invention may be applied to conductivity-modulated junction field effect transistors which contain a single region gate or a differentially doped dual region gate.

Figure 1:
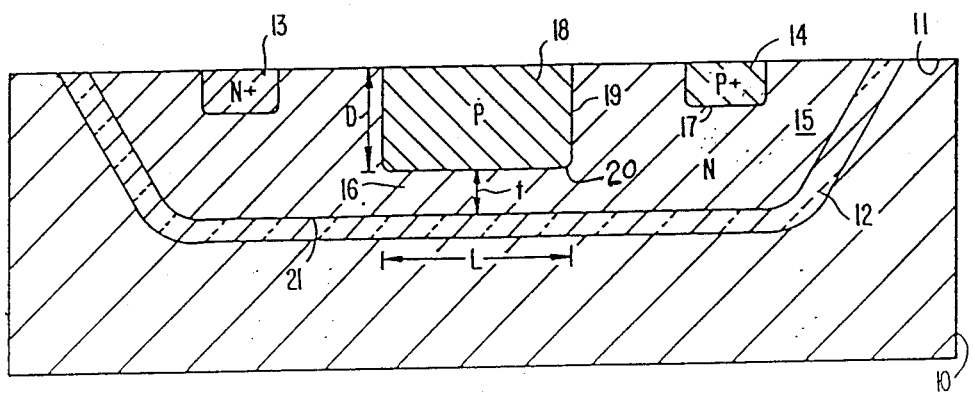
FIG. 1 is a cross-sectional illustration of a conventional conductivity-modulated field effect transistor.
Figure 2:
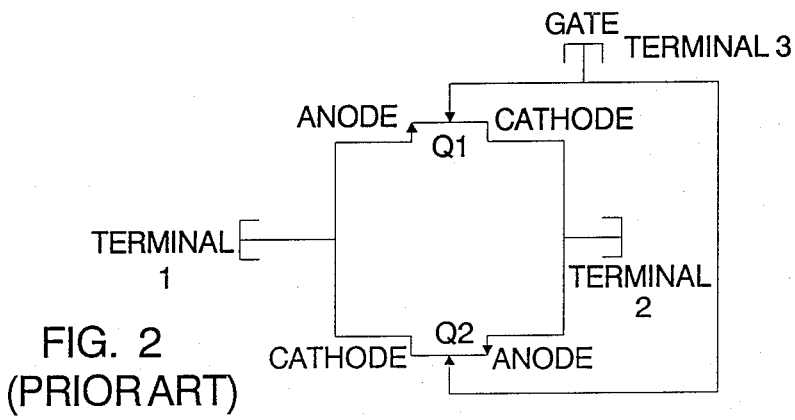
FIG. 2 is a diagrammatic circuit illustration of a pair of conductivity-modulated field effect transistors connected in anti-parallel fashion.
Figure 6:
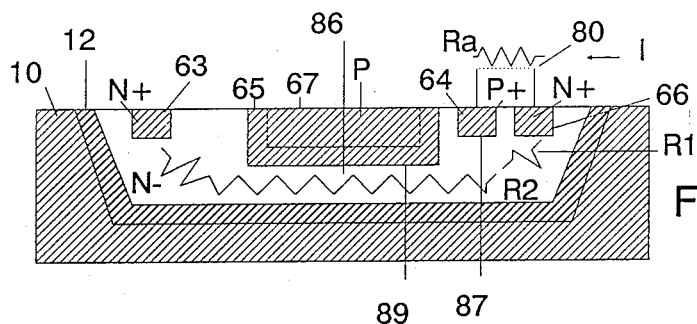
FIG. 6 is a cross-sectional illustration of a conductivity modulated field effect transistor having an anode-auxiliary cathode structure on one side of the gate region.

With attention directed to FIG. 6, a diagrammatic cross-sectional illustration of the geometry of a first embodiment of the second aspect of the invention is illustrated as comprising an ohmic contact (auxiliary cathode) N+ region 66 formed in a surface portion of a N— island region 15 proximal to, but spaced apart from, anode region 64 on one side of the gate region 65. As noted previously, gate region 65 may be either a single region gate or a dual region gate. To simplify the diagrammatic illustration of FIG. 6, a gate region has been shown as an alternative construction with respective regions 65 and 67, separated by a dotted line therebetween. Portion 65 corresponds to region 24 and region 67 corresponds to region 25, respectively, of the device configuration of FIG. 3. An N+ region 63, corresponding to cathode region 13 of the diagrammatic cross-sectional illustrations of each of FIGS. 1 and 2, is shown in the left-hand portion of FIG. 6.

Preferably, P+ anode region 64 and N+ ohmic contact (auxiliary cathode) region 66 are arranged such that current flow from the auxiliary cathode contact region 66 into the N— material of island region 15 through the channel 26 will develop a voltage drop such that, when the ohmic contact region 66 and anode region 64 are tied together, the voltage drop will occur in the N— island region 15 adjacent to the junction 87 between the P+ material of anode region 64 and the N— material of island 15. In FIG. 6, a diagrammatically illustrated resistor component $R_{2(ON)}$ represents the distance from the anode-island junction 87, through the channel 86 to the cathode contact region 63, and I is the current injected into the anode-ohmic contact node 80. The resistance R1 represents the resistance between the ohmic contact region 66 and the junction 87. Thus, the voltage between terminal 80 and the cathode region 63 will be given by $I(R_1+R_2)$.

When the current I increases to a value such that $IR_1$ equals the turn-on voltage ($V_F$) of the anode-island junction 87, the junction will begin to conduct, since the same voltage is applied on both sides of the junction. When the anode region 64 begins to conduct, the resistance $R_2$ through the channel is reduced to a small value by conductivity modulation. As a consequence, the total voltage drop between the anode region 64 and the cathode region 63 drops to approximately $V_F$ from an initial value of $V=V(R_1+R_2)/R_1$), just prior to the time when the anode began conducting.

In defining the magnitude of the resistance $R_1$ through the island 15, an additional external resistance shown at $R_a$ may be connected between the surface contacts of respective anode region 64 and ohmic contact (auxiliary cathode contact) 66.

In a modification of the configuration shown in FIG. 6, an anode-ohmic contact pair is provided on both sides of the gate region. This configuration is shown diagrammatically in the cross-sectional illustration of FIG. 7 wherein gate region 75 (again shown as an optional single/dual region gate 75/77) is formed in island region 15 with respective P+ anode regions 72 and 74 formed on opposite sides of gate region 75 together with approximately located ohmic contact (auxiliary cathode) regions 73 and 74 adjacent thereto. As in the embodiment of FIG. 6, the terminal contacts of each of anode regions 72 and 74 may be connected to the terminal contacts of regions 73 and 76, respectively or may employ an external resistance $R_a$ therebetween, as shown. In either case, this structure will conduct with the application of a voltage of either a positive or negative polarity. Whichever terminal is more positive will have its anode turn on when the appropriate voltage is applied. The more negative terminal will conduct through its ohmic contact only when the adjacent anode (which will be reversed-biased by current flow from its opposite terminal) is inactive.

Figure 7:
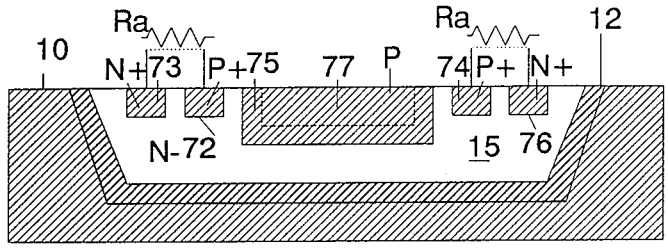
FIG. 7 is a illustration of an embodiment of the use of the anode-auxiliary cathode structure on both sides of the gate region of a conductivity modulated field effect transistor.

With either the embodiment shown in FIG. 6 or that shown in FIG. 7, the improved turn-on configuration of the conductivity modulated field effect transistor of the present invention enjoys a number of advantages contrasted with a prior art configuration which employs only a single anode and a single cathode. First of all, as mentioned above, in order for the device to conduct, the voltage applied across the transistor may be less than the turn-on voltage of the anode-island diode which injects minority carriers into the channel. This reduction in turn-on voltage is achieved by the provision of (an auxiliary cathode) ohmic contact region adjacent to the anode region to provide a reduced anode to island junction resistance. Namely, the provision of the anode region and the ohmic contact (auxiliary cathode) region causes the voltage drop in the channel developed by the flow of current by the ohmic contact to provide a turn-on bias for the conductivity modulating diode at a selected current and voltage (as established by parameters within the device or by the addition of external components (e.g. resistance $R_a$)).

With the use of a dual anode-auxiliary cathode pair on either side of the gate region as shown in FIG. 7, the device will conduct with the application of a voltage of either polarity across the field effect transistor. In effect, the device shown in FIG. 7 contains minority carrier-injecting diodes tied to ohmic contacts on both sides of the gate. This is a considerably simplified semiconductor structure compared with the anti-parallel connection required for achieving the circuit configuration and functionality of the conventional modulated field effect transistor arrangement of FIG. 2, referenced-above (which, incidently, still requires the application of a forward voltage between anode and cathode at least equal to the diode forward voltage therebetween).

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A channel conductivity-modulated field effect semiconductor device comprising:

a body of semiconductor material of a first conductivity type having first and second surfaces;

a gate region of semiconductor material of a second conductivity type, opposite to said first conductivity type, extending from a top portion thereof at said first surface of said body to a bottom portion thereof a prescribed depth from said first surface, space apart apart from said second surface, and forming with the material of said body a PN junction, so that a channel region is defined between said PN junction at the bottom portion of said gate region and said second surface of said body; and means, coupled to said body, for controllably injecting carriers of said second conductivity type into said body, whereby said carriers are caused to flow through and thereby modulate the conductivity of said channel region; and wherein that portion of said gate region which is contiguous with and defines said PN junction at the bottom portion thereof is comprised of relatively high resistivity semiconductor material having a first, relatively low impurity concentration the profile of which gradually varies with depth from said first surface, and said gate region includes a portion of relatively low resistivity semiconductor material having a second, relatively high impurity concentration the profile of which changes abruptly with depth from said first surface, overlying said channel region and being contiguous with the relatively high resistivity semiconductor material thereof, such that said channel region lies beneath a portion of said gate region whereat said relatively high resistivity material and relatively low resistivity material portions are contiguous with one another and said relatively low resistivity material portion is spaced apart from said channel region therebeneath by material of said relatively high resistivity portion of said gate region and such that the composite of said first and second impurity concentration profiles has a knee at a bottom interface whereat said relatively high resistivity material and relatively low resistivity material regions are contiguous with one another, such that from said bottom interface to the bottom of said gate region the impurity concentration profile of said gate region varies from said knee in accordance with the profile of said first, relatively low impurity concentration, and from said bottom interface toward said first surface the impurity concentration profile of said gate region varies abruptly from said knee in accordance with the profile of said second relatively high impurity concentration, whereby, during the on-condition of said device, said channel region is effectively established between said second surface of said body and the bottom interface of said portion of relatively low resistivity material and said portion of relatively high resistivity material whereat the composite of said first and second impurity concentration profiles undergoes an abrupt change at said knee, during turn-off of said device said low resistivity portion provides a low resistance path for removal of carriers of said second conductivity type and, in the off-condition of said device, said channel region is confined between said PN junction at the bottom portion of said gate region and said second surface of said body.

2. A channel conductivity-modulated field effect semiconductor device according to claim 1, wherein the peak impurity concentration of said relatively low resistivity portion of said gate region is at least an order of magnitude greater than the peak impurity concentration of said relatively high resistivity portion.

3. A channel conductivity-modulated field effect semiconductor device according to claim 1, wherein the impurity concentration of a portion of said relatively high resistivity portion of said gate region is greater than the concentration of carriers in said channel region.

4. A channel conductivity-modulated field effect semiconductor device according to claim 2, wherein said body of semiconductor material comprises an island region of semiconductor of said first conductivity type isolated from a support substrate therefor.

5. A channel conductivity-modulated field effect semiconductor device according to claim 1, further including means, coupled to said body, for removing carriers that have been injected by said carrier injecting means and have modulated said channel region during their flow therethrough, said carrier injecting means and said carrier removing means being formed at spaced apart portions of said first surface of said body between which the top portion said gate region is disposed.

6. A channel conductivity-modulated field effect semiconductor device according to claim 5, further including means, coupled to said body adjacent to at least one of said carrier injecting means and said carrier removing means, for effectively reducing the voltage, applied between said carrier injecting means and said carrier removing means, that causes said channel to conduct.

7. A channel conductivity-modulated field effect semiconductor device according to claim 6, wherein said carrier injecting means comprises an anode region of semiconductor material of said second conductivity type formed in a portion of said first surface of said body spaced apart from said gate region, forming a PN junction with said body and to which an anode voltage is applied for forward biasing the PN junction so as to inject carriers into said body, and wherein said voltage reducing means comprises an auxiliary region of semiconductor material of said first conductivity type formed in a portion of said first surface of said body adjacent to said anode region, and further including means for ohmically coupling said auxiliary region to said anode region.

8. A channel conductivity-modulated field effect semiconductor device according to claim 7, wherein said carrier removing means comprises a cathode region of semiconductor material of said first conductivity type formed in a portion of said first surface of said body spaced apart from said gate region to which a cathode voltage is applied for removing carriers from said body, and wherein said voltage reducing means comprises an auxiliary region of semiconductor material of said second conductivity type formed in a portion of said first surface of said body adjacent to said cathode region and forming a PN junction with said body, and further including means for ohmically coupling said auxiliary region to said cathode region.

9. A channel conductivity-modulated field effect semiconductor device according to claim 6, wherein said carrier removing means comprises a cathode region of semiconductor material of said first conductivity type formed in a portion of said first surface of said body spaced apart from said gate region to which a cathode voltage is applied for removing carriers from said body, and wherein said voltage reducing means comprises an auxiliary region of semiconductor material of said second conductivity type formed in a portion of said first surface of said body adjacent to said cathode region and forming a PN junction with said body, and further including means for ohmically coupling said auxiliary region to said cathode region.

10. A channel conductivity-modulated field effect semiconductor device according to claim 5, wherein said carrier injecting means comprises an anode region of semiconductor material of said second conductivity type formed in a portion of said first surface of said body spaced apart from said gate region, forming a PN junction with said body and to which an anode voltage is applied for forward biasing the PN junction so as to inject carriers into said body, and further including an ohmic contact region of semiconductor material of said first conductivity type formed in a portion of said first surface of said body adjacent to said anode region, and further including means for ohmically coupling said ohmic contact region to said anode region.

11. A channel conductivity-modulated field effect semiconductor device according to claim 10, wherein said carrier removing means comprises a cathode region of semiconductor material of said first conductivity type formed in a portion of said first surface of said body spaced apart from said gate region to which a cathode voltage is applied for removing carriers from said body, and further including an additional anode region of semiconductor material of said second conductivity type formed in a portion of said first surface of said body adjacent to said cathode region and forming a PN junction with said body, and further including means for ohmically coupling said additional anode region to said cathode region.

12. A channel conductivity-modulated field effect semiconductor device according to claim 1, further including a first minority carrier injecting diode region disposed in a portion of said first surface of said body on one side of said gate region, a first ohmic body contact region disposed in a portion of said first surface of said body on said one side of said gate region, first means for providing an ohmic connection between said first minority carrier injecting diode region and said first ohmic body contact region, a second minority carrier injecting diode region disposed in a portion of said first surface of said body on another side of said gate region, opposite to said one side of said gate region, a second ohmic body contact region disposed in a portion of said first surface of said body on said opposite side of said gate region, and second means for providing an ohmic connection between said second minority carrier injecting diode region and said second ohmic body contact region.

13. A channel conductivity-modulated field effect semiconductor device comprising:

a body of semiconductor material of a first conductivity type having first and second surfaces;

first means, coupled to a first portion of said first surface of said body, for controllably injecting into said body carriers of a second conductivity type, opposite to said first conductivity type;

second means, coupled to a second portion of said first surface of said body, spaced apart from said first portion, for removing carriers that have been introduced into said body by said first means; and a gate region of semiconductor material of said second conductivity type, extending from a top portion thereof at said first surface of said body to a bottom portion thereof a prescribed depth from said first surface, spaced apart from said second surface, and forming with the material of said body a PN junction, so that a channel region, which is effectively parallel to said first surface and through which carriers that have been introduced by said first means flow, is defined between said PN junction at the bottom portion of said gate region and said second surface of said body; and wherein that portion of said gate region which is contiguous with and defines said PN junction at the bottom portion thereof is comprised of relatively high resistivity semiconductor material having a first, relatively low impurity concentration the profile of which gradually varies with depth from said first surface, and said gate region includes a portion of relatively low resistivity semiconductor material having a second, relatively high impurity concentration the profile of which changes abruptly with depth from said first surface, overlying said channel region and being contiguous with the relatively high resistivity semiconductor material thereof, such that said channel region lies beneath a portion of said gate region whereat said relatively high resistivity material and relatively low resistivity material portions are contiguous with one another and said relatively low resistivity material portion is spaced apart from said channel region therebeneath by material of said relatively high resistivity portion of said gate region and such that the composite of said first and second impurity concentration profiles has a knee at a bottom interface whereat said relatively high resistivity material and relatively low resistivity material regions are contiguous with one another, such that from said bottom interface to the bottom of said gate region the impurity concentration profile of said gate region varies from said knee in accordance with the profile of said first, relatively low impurity concentration, and from said bottom interface toward said first surface the impurity concentration profile of said gate region varies abruptly from said knee in accordance with the profile of said second relatively high impurity concentration, whereby, during the on-condition of said device, said channel region is effectively established between said second surface of said body and the bottom interface of said portion of relatively low resistivity material and said portion of relatively high resistivity material whereat the composite of said first and second impurity concentration profiles undergoes an abrupt change at said knee, during turn-off of said device said low resistivity portion provides a low resistance path for removal of carriers of said second conductivity type and, in the off-condition of said device, said channel region is confined between said PN junction at the bottom portion of said gate region and said second surface of said body.

14. A channel conductivity-modulated field effect semiconductor device according to claim 13, wherein the peak impurity concentration of said relatively low resistivity portion of said gate region is at least an order of magnitude greater than the peak impurity concentration of said relatively high resistivity portion.

15. A channel conductivity-modulated field effect semiconductor device according to claim 13, wherein the impurity concentration of a portion of said relatively high resistivity portion of said gate region is greater than the concentration of carriers in said channel region.

16. A channel conductivity-modulated field effect semiconductor device according to claim 13, wherein said body of semiconductor material comprises an island region of semiconductor of said first conductivity type isolated from a support substrate therefor.

17. A channel conductivity-modulated field effect semiconductor device according to claim 13, further including means, coupled to said body adjacent to at least one of said firt means and said second means, for effectively reducing the voltage, applied between said first and second means, that causes said channel to conduct.

18. A channel conductivity-modulated field effect semiconductor device according to claim 17, wherein said first means comprises an anode region of semiconductor material of said second conductivity type formed in a portion of said first surface of said body spaced apart from said gate region, forming a PN junction with said body and to which anode voltage is applied for forward biasing the PN junction so as to inject carriers into said body, and wherein said voltage reducing means comprises an auxiliary region of semiconductor material of said first conductivity type formed in a portion of said first surface of said body adjacent to said anode region, and further including means for ohmically coupling said auxiliary region to said anode region.

19. A channel conductivity-modulated field effect semiconductor device according to claim 18, wherein said second means comprises a cathode region of semiconductor material of said first conductivity type formed in a portion of said first surface of said body spaced apart from said gate region to which a cathode voltage is applied for removing carriers from said body, and wherein said voltage reducing means comprises an auxiliary region of semiconductor material of said second conductivity type formed in a portion of said first surface of said body adjacent to said cathode region and forming a PN junction with said body, and further including means for ohmically coupling said auxiliary region to said cathode region.

20. A channel conductivity-modulated field effect semiconductor device according to claim 17, wherein said second means comprises a cathode region of semiconductor material of said first conductivity type formed in a portion of said first surface of said body spaced apart from said gate region to which a cathode voltage is applied for removing carriers from said body, and wherein said voltage reducing means comprises an auxiliary region of semiconductor material of said second conductivity type formed in a portion of said first surface of said body adjacent to said cathode region and forming a PN junction with said body, and further including means for ohmically coupling said auxiliary region to said cathode region.

21. A channel conductivity-modulated field effect semiconductor device according to claim 13, wherein said first means comprises an anode region of semiconductor material of said second conductivity type formed in a portion of said first surface of said body spaced apart from said gate region, forming a PN junction with said body and to which an anode voltage is applied for forward biasing the PN junction so as to inject carriers into said body, and further including an ohmic contact region of semiconductor material of said first conductivity type formed in a portion of said first surface of said body adjacent to said anode region, and further including means for ohmically coupling said ohmic contact region to said anode region.

22. A channel conductivity-modulated field effect semiconductor device according to claim 21, wherein said second means comprises a cathode region of semiconductor material of said first conductivity type formed in a portion of said first surface of said body spaced apart from said gate region to which a cathode voltage is applied for removing carriers from said body, and further including an additional anode region of semiconductor material of said second conductivity type formed in a portion of said first surface of said body adjacent to said cathode region and forming a PN junction with said body, and further including means for ohmically coupling said additional anode region to said cathode region.

23. For use in a channel conductivity-modulated field effect transistor having a body semiconductor material of a first conductivity type having first and second surfaces, first means, coupled to a first portion of said first surface of said body, for controllably injecting into said body carriers of a second conductivity type, opposite to said first conductivity type, second means, coupled to a second portion of said first surface of said body, spaced apart from said first portion, for removing carriers that have been introduced into said body by said first means, and a gate region of semiconductor material of said second conductivity type, extending from a top portion thereof at said first surface of said body to a bottom portion thereof a prescribed depth from said first surface, spaced apart from said second surface, and forming with the material of said body of a PN junction, so that a channel region, which is effectively parallel to said first surface and through which carriers that have been introduced by said first means flow, is defined between said PN junction at the bottom portion of said gate region and said second surface of said body, a method of controlling the size of said channel comprising the step of causing a variation in the resistivity of said gate region such that that portion of said gate region which is contiguous with and defines said PN junction at the bottom portion thereof is comprised of relatively high resistivity semiconductor material having a first, relatively low impurity concentration the profile of which gradually varies with depth from said first surface, and said gate region includes a portion of relatively low resistivity semiconductor material having a second, relatively high impurity concentration the profile of which changes abruptly with depth from said first surface, overlying said channel region and being contiguous with the relatively high resistivity semiconductor material thereof such that said channel region lies beneath a portion of said gate region whereat said relatively high resistivity material and relatively said relatively high resistivity material and relatively low resistivity material portions are contiguous with one another and said relatively low resistivity material portion is spaced apart from said channel region therebeneath by material of said relatively high resistivity portion of said gate region and such that the composite of said first and second impurity concentration profiles has a knee at a bottom interface whereat said relatively high resistivity material and relatively low resistivity material regions are contiguous with one another, such that from said bottom interface to the bottom of said gate region the impurity concentration profile of said gate region varies from said knee in accordance with the profile of said first, relatively low impurity concentration, and from said bottom interface toward said first surface the impurity concentration profile of said gate region varies abruptly from said knee in accordance with the profile of said second relatively high impurity concentration, whereby, during the on-condition of said device, said channel region is effectively established between said second surface of said body and the bottom interface of said portion of relatively low resistivity material and said portion of relatively high resistivity material whereat the composite of said first and second impurity concentration profiles undergoes an abrupt change at said knee, during turn-off of said device said low resistivity portion provides a low resistance path for removal of carriers of said second conductivity type and, in the off-condition of said device, said channel region is confined between said PN junction at the bottom portion of said gate region and said second surface of said body.

24. A method according to claim 23, wherein the peak impurity concentration of said portion of relatively low resistivity semiconductor material of said gate region is at least an order of magnitude greater than the peak impurity concentration of said relatively high resistivity portion.

25. A method according 23, wherein the impurity concentration of said portion of said gate region which is comprised of said relatively high resistivity semiconductor material is greater than the concentration of carriers in said channel region.

26. A method according to claim 23, wherein said body of semiconductor material comprises an island region of semiconductor of said first conductivity type isolated from a support substrate therefor.

27. A channel conductivity-modulated field effect semiconductor device comprising:
a body of semiconductor material of a first conductivity type having first and second surfaces;
first means, coupled to a first portion of said first surface of said body, for controllably injecting into said body carriers of a second conductivity type, opposite to said first conductivity type;
second means, coupled to a second portion of said first surface of said body, spaced apart from said first portion, for removing carriers that have been introduced into said body by said first means;
a gate region of semiconductor material of said second conductivity type, extending from a top portion thereof at said first surface of said body to a bottom portion thereof a prescribed depth from said first surface, spaced apart from said second surface, and forming with the material of said body a PN junction, so that a channel region, which is effectively parallel to said first surface and through which carriers that have been introduced by said first means flow, is defined between said PN junction at the bottom portion of said gate region and said second surface of said body; and third means, coupled to said body adjacent to at least one of said first means and said second means, for effectively reducing the voltage, applied between said first and second means, that causes said channel to conduct.

28. A channel conductivity-modulated field effect semiconductor device according to claim 27, wherein said first means comprises an anode region of semiconductor material of said second conductivity type formed in a portion of said first surface of said body spaced apart from said gate region, forming a PN junction with said body and to which an anode voltage is applied for forward biasing the PN junction so as to inject carriers into said body, and wherein said third means comprises an auxiliary region of semiconductor material of said first conductivity type formed in a portion of said first surface of said body adjacent to said anode region, and further including means for ohmically coupling said auxiliary region to said anode region.

29. A channel conductivity-modulated field effect semiconductor device according to claim 28, wherein said second means comprises a cathode region of semiconductor material of said first conductivity type formed in a portion of said first surface of said body spaced apart from said gate region to which a cathode voltage is applied for removing carriers from said body, and wherein said third means comprises an auxiliary region of semiconductor material of said second conductivity type formed in a portion of said first surface of said body adjacent to said cathode region and forming a PN junction with said body, and further including means for ohmically coupling said auxiliary region to said cathode region.

30. A channel conductivity-modulated field effect semiconductor device according to claim 27, wherein said second means comprises a cathode region of semiconductor material of said first conductivity type formed in a portion of said first surface of said body spaced apart from said gate region to which a cathode voltage is applied for removing carriers from said body, and wherein said third means comprises an auxiliary region of semiconductor material of said second conductivity type formed in a portion of said first surface of said body adjacent to said cathode region and forming a PN junction with said body, and further including means for ohmically coupling said auxiliary region to said cathode region.

31. A channel conductivity-modulated field effect semiconductor device according to claim 27, wherein said first means comprises an anode region of semiconductor material of said second conductivity type formed in a portion of said first surface of said body spaced apart from said gate region, forming a PN junction with said body and to which an anode voltage is applied for forward biasing the PN junction so as to inject carriers into said body, and further including an ohmic contact region of semiconductor material of said first conductivity type formed in a portion of said first surface of said body adjacent to said anode region, and further including means for ohmically coupling said ohmic contact region to said anode region.

32. A channel conductivity-modulated field effect semiconductor device according to claim 31, wherein said second means comprises a cathode region of semiconductor material of said first conductivity type formed in a portion of said first surface of said body spaced apart from said gate region to which a cathode voltage is applied for removing carriers from said body, and further including an additional anode region of semiconductor material of said second conductivity type formed in a portion of said first surface of said body adjacent to said cathode region and forming a PN junction with said body, and further including means for ohmically coupling said additional anode region to said cathode region.

33. A channel conductivity-modulated field effect semiconductor device comprising;

a body of semiconductor material of a first conductivity type having first and second surfaces;

a gate region of semiconductor material of a second conductivity type, opposite to said first conductivity type, extending from a top portion thereof at said first surface of said body to a bottom portion thereof a prescribed depth from said first surface, and forming with the material of said body a PN junction, so that a channel region, which is effectively parallel to said first surface and through which carriers that have been introduced into said body flow, is defined between said PN junction at the bottom portion of said gate region and said second surface of said body;

a first minority carrier injecting diode region disposed in a portion of said first surface of said body on one side of said gate region;

a first ohmic body contact region disposed in a portion of said first surface of said body on said one side of said gate region;

first means for providing an ohmic connection between said first minority carrier injecting diode region and said first ohmic body contact region;

a second minority carrier injecting diode region disposed in a portion of said first surface of said body on another side of said gate region opposite to said one side of said gate region;

a second ohmic body contact region disposed in a portion of said first surface of said body on said opposite side of said gate region; and second means for providing an ohmic connection between said second minority carrier injecting diode region and said second ohmic body contact region.

34. A channel conductivity-modulated field effect semiconductor device according to claim 33, wherein that portion of said gate region which is contiguous with and defines said PN junction at the bottom portion thereof is comprised of relatively high resistivity semiconductor material having a first, relatively low impurity concentration the profile of which gradually varies with depth from said first surface, and said gate region includes a portion of relatively low resistivity semiconductor material having a second, relatively high impurity concentration the profile of which changes abruptly with depth from said first surface, overlying said channel region and being contiguous with the relatively high resistivity semiconductor material thereof such that said channel region lies beneath a portion of said gate region whereat said relatively high resistivity material and relatively low resistivity material portions are contiguous with one another and said relatively low resistivity material portion is spaced apart from said channel region therebeneath by material of said relatively high resistivity portion of said gate region and such that the composite of said first and second impurity concentration profiles has a knee at a bottom interface whereat said relatively high resistivity material and relatively low resistivity material regions are contiguous with one another, such that from said bottom interface to the bottom of said gate region the impurity concentration profile of said gate region varies from said knee in accordance with the profile of said first, relatively low impurity concentration, and from said bottom interface toward said first surface the impurity concentration profile of said gate region varies abruptly from said knee in accordance with the profile of said second relatively high impurity concentration, whereby, during the on-condition of said device, said channel region is effectively established between said second surface of said body and the bottom interface of said portion of relatively low resistivity material and said portion of relatively high resistivity material whereat the composite of said first and second impurity concentration profiles undergoes an abrupt change at said knee, during turn-off of said device said low resistivity portion provides a low resistance path for removal of carriers of said second conductivity type and, in the off-condition of said device, said channel region is confined between said PN junction at the bottom portion of said gate region and said second surface of said body.

35. A channel conductivity-modulated field effect semiconductor device according to claim 34, wherein the peak impurity concentration of said low resistivity portion of said gate region is at least an order of magnitude greater than the peak impurity concentration of said relatively high resistivity portion.

* * * * *